United States Patent
Takabe et al.

(10) Patent No.: US 10,207,503 B2
(45) Date of Patent: Feb. 19, 2019

(54) MEMS DEVICE, LIQUID EJECTING HEAD, LIQUID EJECTING APPARATUS, AND MEMS DEVICE MANUFACTURING METHOD

(71) Applicant: Seiko Epson Corporation, Tokyo (JP)

(72) Inventors: Motoki Takabe, Shiojiri (JP); Shingo Tomimatsu, Matsumoto (JP); Shunsuke Watanabe, Matsumoto (JP)

(73) Assignee: Seiko Epson Corporation (JP)

( * ) Notice: Subject to any disclaimer, the term of this patent is extended or adjusted under 35 U.S.C. 154(b) by 80 days.

(21) Appl. No.: 15/405,540

(22) Filed: Jan. 13, 2017

(65) Prior Publication Data

US 2018/0111372 A1   Apr. 26, 2018

(30) Foreign Application Priority Data

Jan. 20, 2016   (JP) ................. 2016-008506

(51) Int. Cl.
*B41J 2/14*      (2006.01)
*H01L 41/047*    (2006.01)
*H01L 41/29*     (2013.01)
*B41J 2/16*      (2006.01)

(52) U.S. Cl.
CPC .......... *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1646* (2013.01); *H01L 41/0475* (2013.01); *H01L 41/29* (2013.01);

(Continued)

(58) Field of Classification Search
CPC .. B41J 2/14282; B41J 2/1429; B41J 2/14298; B41J 2002/14217; B41J 2002/14225; B41J 2002/14306; B41J 2002/14258; B41J 2002/14241; B41J 2002/1425; B41J 2002/14266; B41J 2002/14491; H01L 41/29; H01L 41/0475
See application file for complete search history.

(56) References Cited

U.S. PATENT DOCUMENTS

2005/0239233 A1   10/2005   Shinkai
2007/0031995 A1*   2/2007   Kaneko ................. H01L 24/12
                                                 438/119

(Continued)

FOREIGN PATENT DOCUMENTS

JP   2001-203229 A   7/2001
JP   2005-125521 A   5/2005
JP   2006-251281 A   9/2006

(Continued)

*Primary Examiner* — Kristal Feggins
(74) *Attorney, Agent, or Firm* — Harness, Dickey & Pierce, P.L.C.

(57) ABSTRACT

A MEMS device includes a first substrate provided with a plurality of first electrode terminals and a second substrate composed of a crystalline substrate and provided with a plurality of second electrode terminals respectively corresponding to the first electrode terminals. The first electrode terminals and the second electrode terminals are electrically bonded one-to-one. Protrusions are formed at positions corresponding to the first electrode terminals on a mounting face of the second substrate opposing the first substrate. The second electrode terminals include the protrusions and conductive material covering the protrusions.

8 Claims, 9 Drawing Sheets

(52) U.S. Cl.
CPC ............... *B41J 2002/14258* (2013.01); *B41J 2002/14362* (2013.01); *B41J 2002/14491* (2013.01)

(56) References Cited

U.S. PATENT DOCUMENTS

2014/0292942 A1 10/2014 Torimoto et al.
2015/0217567 A1 8/2015 Torimoto et al.

FOREIGN PATENT DOCUMENTS

| | | |
|---|---|---|
| JP | 2009-078564 A | 4/2009 |
| JP | 2010-260187 A | 11/2010 |
| JP | 2011-023510 A | 2/2011 |
| JP | 2012-199262 A | 10/2012 |
| JP | 2013-135116 A | 7/2013 |
| JP | 2014-188782 A | 10/2014 |

* cited by examiner

MEMS DEVICE, LIQUID EJECTING HEAD, LIQUID EJECTING APPARATUS, AND MEMS DEVICE MANUFACTURING METHOD

BACKGROUND

1. Technical Field

The present invention relates to a MEMS device such as a liquid ejecting head, a liquid ejecting head, a liquid ejecting apparatus, and a MEMS device manufacturing method, and in particular, relates to a MEMS device including a first substrate having first electrode terminals and a second substrate having second electrode terminals, a liquid ejecting head, a liquid ejecting apparatus, and a MEMS device manufacturing method.

2. Related Art

Microelectromechanical systems (MEMS) devices including a driving element such as a piezoelectric element, an electronic circuit, or the like on a silicon substrate, have applications in various liquid ejecting apparatuses, display devices, vibration sensors, and the like. For example, in a liquid ejecting apparatus, various liquids are ejected (discharged) from a liquid ejecting head, this being one form of MEMS device. In such a MEMS device, a configuration is adopted in which plural substrates handling electrical signals for driving a driving element or the like are electrically connected together (for example, see JP-A-2012-199262). In JP-A-2012-199262, a circuit board employed in a liquid crystal display is electrically connected to a flexible circuit having flexibility. The flexible substrate and the circuit board are both provided with plural electrode terminals, and the electrode terminals of the flexible substrate are bonded to those of the circuit board by thermocompression with a bonding material (resin layer 6) such as a non-conductive bonding material that does not include conductive particles (non-conductive film NCF or non-conductive paste NCP) interposed therebetween.

Figure 16:
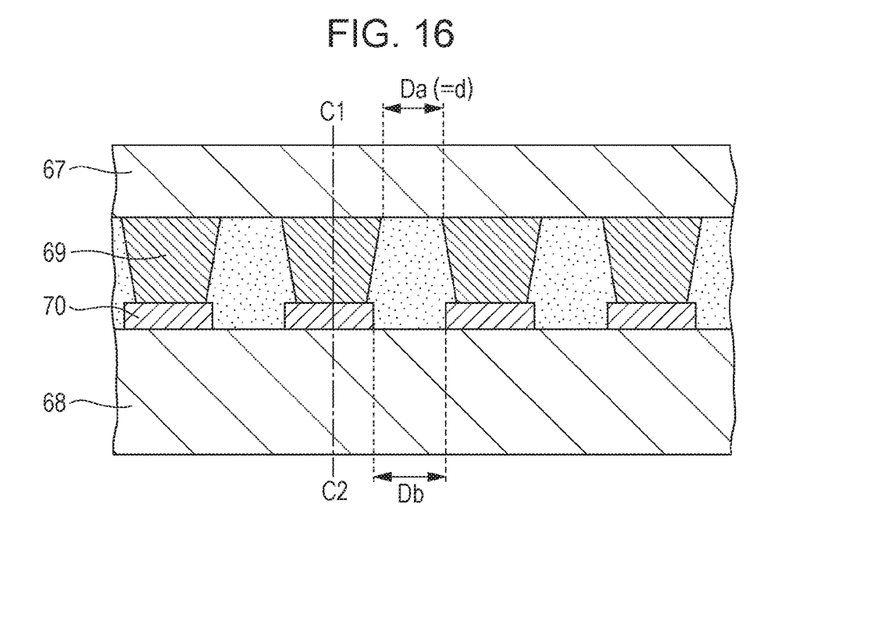
FIG. 16 is a cross-section illustrating an electrode terminal connection state in related configuration.
Figure 17:
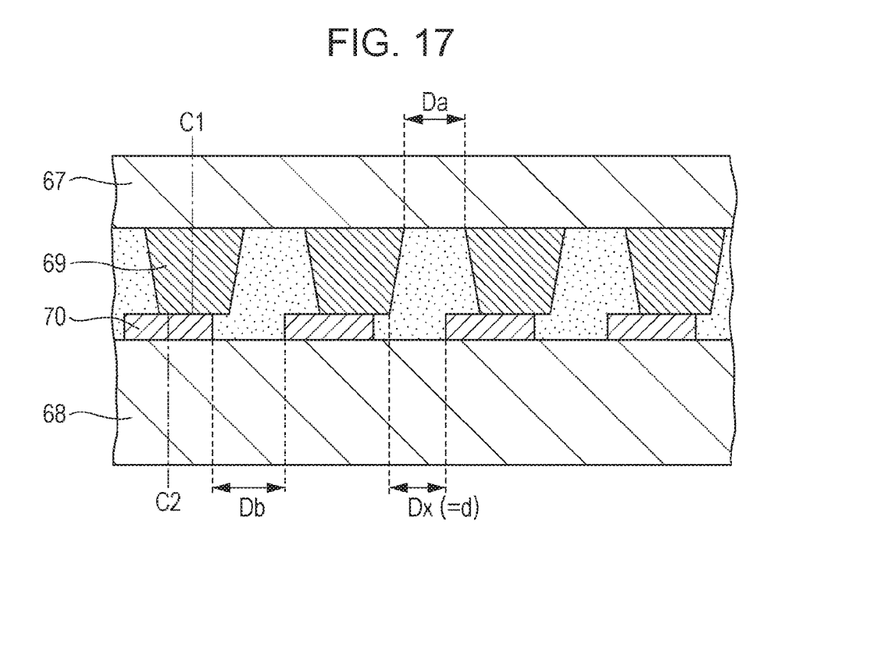
FIG. 17 is a cross-section illustrating an electrode terminal connection state in related configuration.

In recent years, the distance between terminals has grown narrower in accordance with demands that liquid ejecting heads be smaller, have higher resolution, or the like. In a configuration in which signals in a range from 0 V to 42 V are input to and output from respective terminals, for example, the maximum voltage of 42 V is sometimes applied across neighboring terminals. In such cases, migration, shorting, or the like is liable to occur between neighboring terminals when the distance between terminals is narrow. In the following, the minimum distance between terminals refers to the minimum distance (the shortest distance to an adjacent electrode terminal) between adjacent electrode terminals in a terminal array direction when viewing a pair of mutually connected electrode terminals as a single electrode terminal. For example, in the configuration illustrated in FIG. 16, when a distance between adjacent electrode terminals 69 of one substrate 67 is Da, and a distance between adjacent electrode terminals 70 of another substrate 68 is Db (>Da), in cases in which the electrode terminals 69, 70 are properly positioned (in a state in which centers C1, C2 of the electrode terminals in the terminal array direction are substantially in agreement) and connected together, the minimum distance between terminals d is Da. Accordingly, Da is normally designed to be a value in a range where migration or the like does not occur (a design value for the minimum terminal distance d is Da). However, as illustrated in FIG. 17, as a result of relative positional displacement between connected electrode terminals (in a state in which the centers C1, C2 are displaced with respect to each other) due to an error in the dimension or shape of the electrode terminals, a positioning error of the substrates 67, 68, or the like, a distance Dx in the terminal array direction of adjacent first electrode terminals and second electrode terminals is sometimes smaller than the distance Da due to the terminals moving closer to each other. Namely, in such cases, the minimum distance between terminals d becomes Dx, which is smaller than the design value Da, and thus faults such as migration are liable to occur more easily.

SUMMARY

An advantage of some aspects of the invention is that a MEMS device, a liquid ejecting head, a liquid ejecting apparatus, and a MEMS device manufacturing method are capable of suppressing faults such as migration and shorting.

A MEMS device according to an aspect of the invention includes a first substrate provided with plural first electrode terminals and a second substrate composed of a crystalline substrate and provided with plural second electrode terminals respectively corresponding to the first electrode terminals. The first electrode terminals and the second electrode terminals of the MEMS device are electrically bonded one-to-one. Protrusions are formed at positions corresponding to the first electrode terminals on a mounting face of the second substrate opposing the first substrate. The second electrode terminals include the protrusions and conductive material covering the protrusions.

According to the above configuration, the second electrode terminals include the protrusions formed on the second substrate, this being a crystalline substrate, and conductive material covering the protrusions, thereby enabling the second electrode terminals to be formed with precise dimensions and shapes due to forming the protrusions using anisotropic etching or the like. Positional displacement between the first electrode terminals and the second electrode terminals resulting from an error in the dimensions or the like of the second electrode terminals are therefore less liable to occur. Accordingly, faults such as migration due to the minimum distance between terminals being smaller than a design value due to positional displacement or the like between electrode terminals can be suppressed. As a result, the reliability of the connection between the first electrode terminals and second electrode terminals is increased.

In the above configuration, it is preferable that a dimension in a terminal array direction of the second electrode terminals at faces bonded to the first electrode terminals be smaller than a dimension in a terminal array direction of the first electrode terminals at faces bonded to the second electrode terminals.

According to this configuration, a dimension in a terminal array direction of the bonding faces of the second electrode terminals is smaller than a dimension in a terminal array direction of the bonding faces of the first electrode terminals, and so even if positional displacement between the first electrode terminals and the second electrode terminals occurs as a result of a positioning error or the like between the first substrate and the second substrate, the bonding faces of the second electrode terminals are easily kept within a range of the bonding faces of the first electrode terminals in the terminal array direction. Accordingly, faults such as migration due to the minimum distance between terminals of adjacent electrode terminals being smaller than a design value can be suppressed.

In the above configuration, it is preferable that the protrusions and recesses between adjacent protrusions extend in a direction intersecting the terminal array direction.

According to this configuration, even with configuration in which a dimension in a terminal array direction of the second electrode terminals at bonding faces is smaller than a dimension in a terminal array direction of the first electrode terminals at bonding faces, the protrusions extend in a direction intersecting the terminal array direction, and so an effective contact area between the first electrode terminals and the second electrode terminals can be sufficiently secured along this direction. In configuration in which the first electrode terminals and the second electrode terminals are connected by compression bonding using a bonding material such as non-conductive resin, bonding material displaced from between the first electrode terminals and the second electrode terminals is introduced into recesses between adjacent protrusions, and so the contact area between the first electrode terminals and the second electrode terminals can be even more reliably secured. Moreover, the first substrate and the second substrate are even more reliably bonded together due to the bonding material introduced into the recesses. Furthermore, the electrical insulation between adjacent electrode terminals can be increased due to the bonding material being introduced into the recesses. Accordingly, the reliability of the connection between the first electrode terminals and second electrode terminals can be increased even further.

In the above configuration, it is preferable that a silicon oxide film be provided between the conductive material and the protrusions.

According to this configuration, faults such as migration between adjacent electrode terminals can be suppressed due to providing the silicon oxide film, which functions as an insulating film, between the conductive material and the protrusions.

A liquid ejecting head according to an aspect of the invention includes one of the above MEMS devices.

A liquid ejecting apparatus according to an aspect of the invention includes the above liquid ejecting head.

According to the above configuration, an even more reliable liquid ejecting head and liquid ejecting apparatus can be provided.

A method of manufacturing a MEMS device according to an aspect of the invention is a manufacturing method to manufacture any of the MEMS devices described above. The manufacturing method includes forming the protrusions by anisotropically etching the mounting face of the second substrate.

According to the above manufacturing method, the protrusions can be formed with higher precision.

In the above manufacturing method, it is preferable that the method further include covering the formed protrusions with a conductive material.

According to the above manufacturing method, second electrode terminals are obtained with more precise dimensions and shapes due to the protrusions formed using anisotropic etching and being covered by a conductive material.

In the above manufacturing method, it is preferable that the method further include aligning the first substrate and the second substrate such that the bonding faces of the second electrode terminals are disposed in the terminal array direction within a range of the corresponding bonding faces of the first electrode terminals.

According to this manufacturing method, the minimum distance between terminals is suppressed from becoming smaller than a design value due to bonding faces of the second electrode terminals being disposed in the terminal array direction within a range of the corresponding bonding faces of the first electrode terminals.

In the above manufacturing method, it is preferable that the method further include forming a silicon oxide film on the mounting face of the second substrate after forming the protrusions.

According to this manufacturing method, faults such as migration between adjacent electrode terminals can be suppressed due to the silicon oxide film, which functions as an insulating film, being formed between the conductive material and the protrusions.

BRIEF DESCRIPTION OF THE DRAWINGS

The invention will be described with reference to the accompanying drawings, wherein like numbers reference like elements.

DESCRIPTION OF EXEMPLARY EMBODIMENTS

Explanation follows regarding embodiments of the invention, with reference to the accompanying drawings. The embodiments described below include various limitations as preferable specific examples of the invention. However, the scope of the invention is not limited thereby unless specifically indicated to be so in the following explanation. Moreover, in the following, explanation is given using examples of an ink jet recording head (hereinafter, recording head), this being one form of MEMS device according to the invention, and one form of liquid ejecting head according to the invention, and an ink jet printer (hereinafter, printer), this being one form of liquid ejecting apparatus equipped with the recording head.

Figure 1:
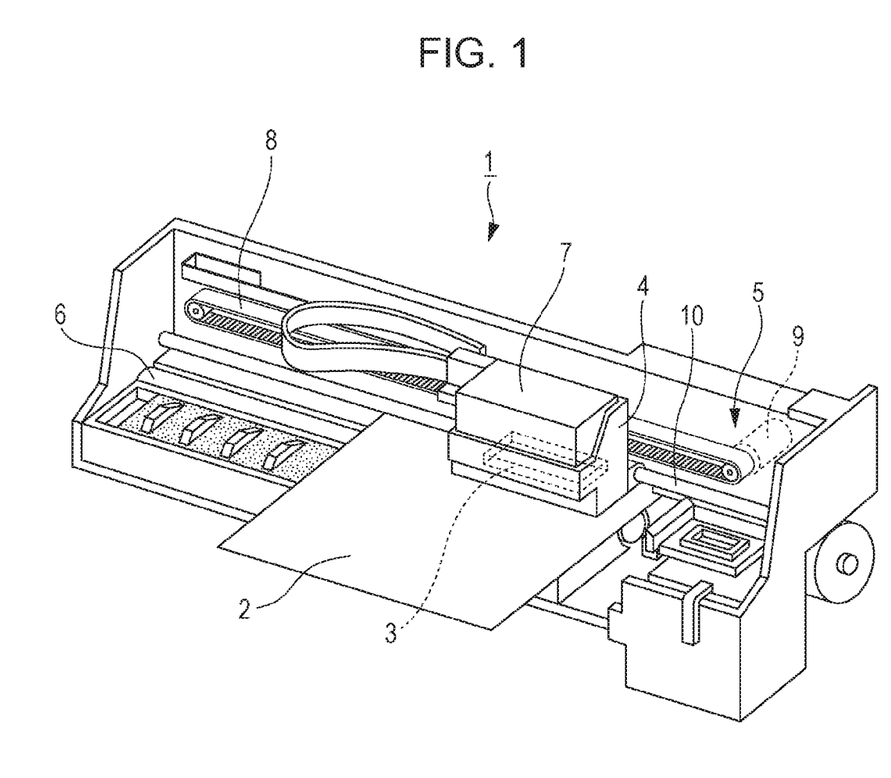
FIG. 1 is a perspective view illustrating configuration of a liquid ejecting apparatus (printer).

Configuration of a printer 1 is described with reference to FIG. 1. Printer 1 is an apparatus that ejects ink (one type of liquid) onto the surface of a recording medium 2 such as recording paper to record images or the like. The printer 1 includes a recording head 3, a carriage 4 that is equipped with the recording head 3, a carriage moving mechanism 5 that moves the carriage 4 along a primary scanning direction, a transport mechanism 6 that moves the recording medium 2 along a secondary scanning direction, and the like. The ink is stored in an ink cartridge 7 that serves as a liquid supply source. The ink cartridge 7 is disposed in the carriage 4 so as to supply ink stored therein to the recording head 3. Note that configuration may be made in which the ink cartridge is disposed on a main body side of the printer, and ink is supplied from the ink cartridge to the recording head through ink supply tubing.

The carriage moving mechanism 5 includes a timing belt 8. The timing belt 8 is driven by a pulse motor 9 such as a DC motor. Accordingly, when the pulse motor 9 is actuated, the carriage 4 is guided along a guide rod 10 spanning across the printer 1, and moves back and forth along the primary scanning direction (a width direction of the recording medium 2). The position of the carriage 4 in the primary scanning direction is detected by a linear encoder (not illustrated in the drawings), this being one type of position information detector, and obtained by a controller of the printer 1.

Figure 2:
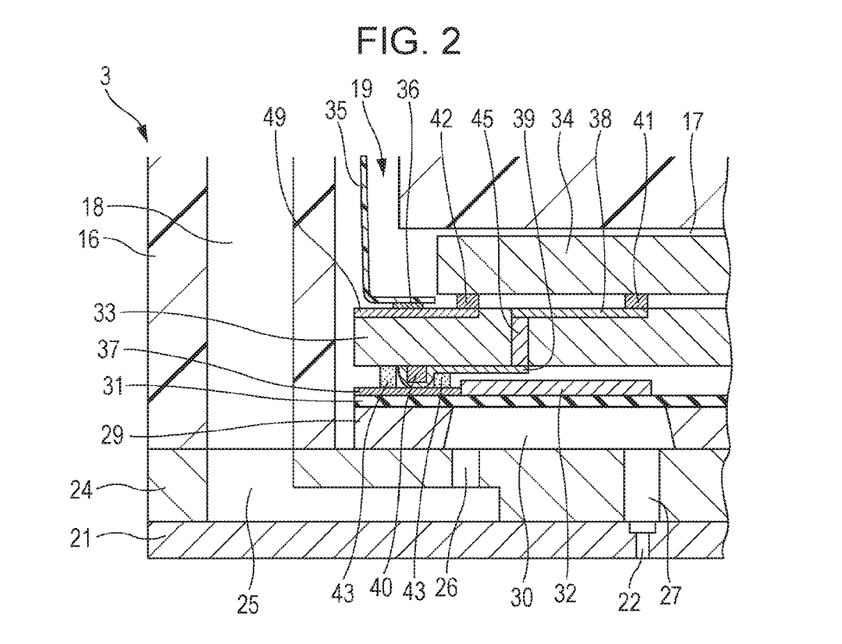
FIG. 2 is a cross-section illustrating configuration of a MEMS device (recording head).
Figure 3:
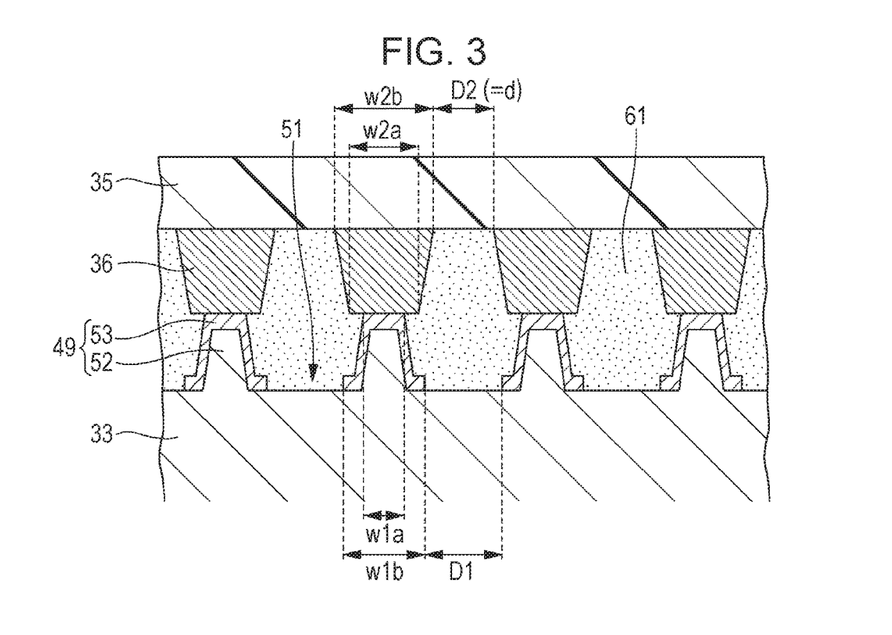
FIG. 3 is a cross-section of connecting portions between first electrode terminals (wiring electrode terminals) of a first substrate (flexible substrate) and second electrode terminals (substrate electrode terminals) of a second substrate (interposing substrate).
Figure 4:
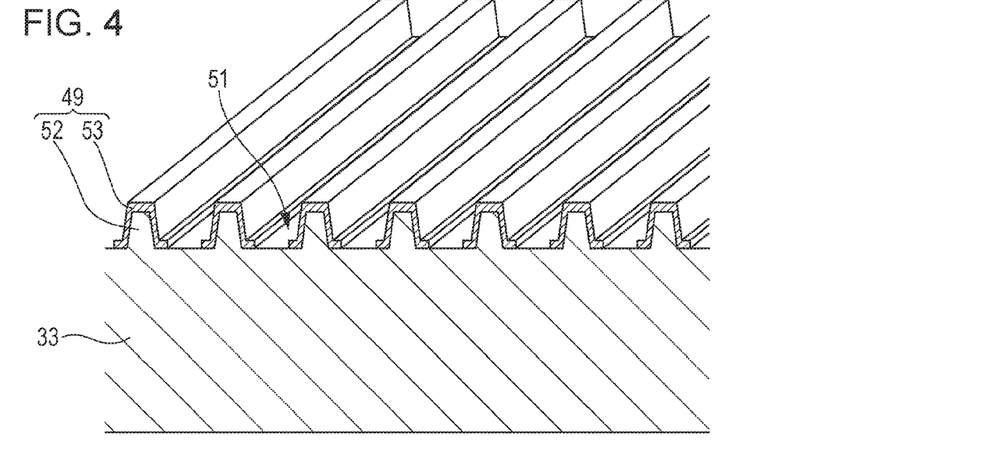
FIG. 4 is a perspective view of second electrode terminals.
Figure 5:
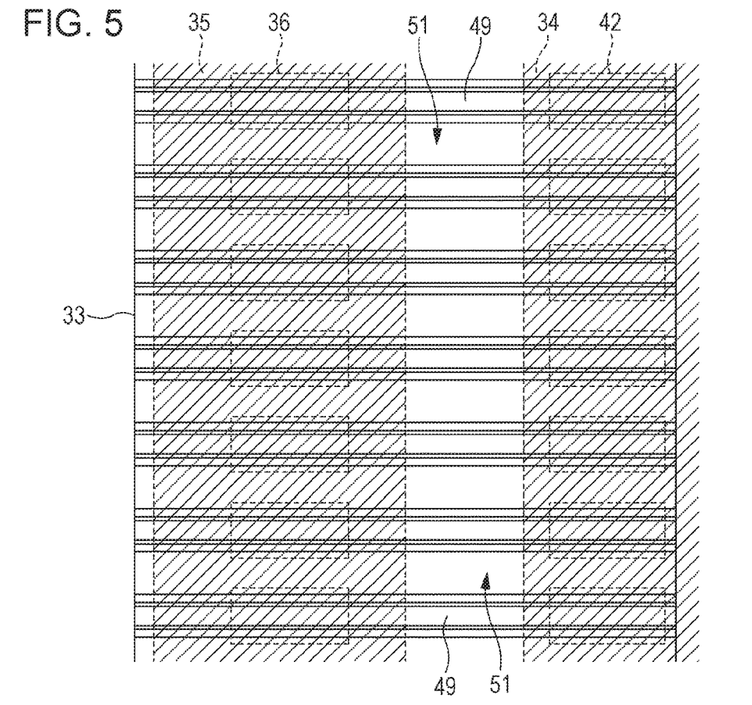
FIG. 5 is a plan view of second electrode terminals.
Figure 6:
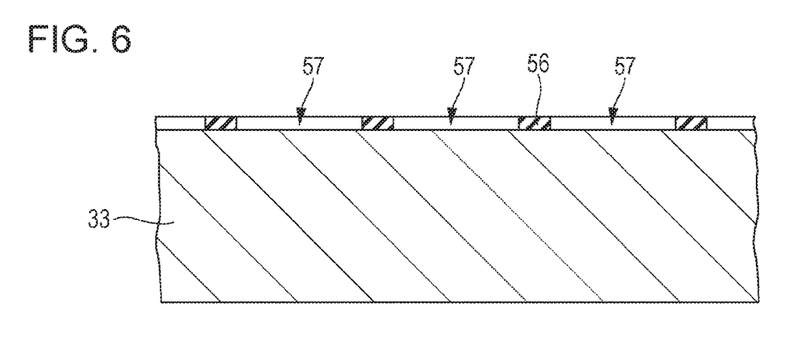
FIG. 6 is a process diagram illustrating a MEMS device manufacturing method.

Next, explanation is given regarding the recording head 3. FIG. 2 is a cross-section illustrating configuration of the recording head 3. FIG. 3 is a cross-section of connecting portions between substrate electrode terminals 49 of an interposing substrate 33 and wiring electrode terminals 36 of a flexible substrate 35. FIG. 4 is a perspective view of the substrate electrode terminals 49 of the interposing substrate 33. FIG. 5 is a plan view of the substrate electrode terminals 49 of the interposing substrate 33.

As illustrated in FIG. 2, plural substrates and the like are stacked and attached to a head case 16 to configure the recording head 3 of the present embodiment. The substrates are stacked in the order of a nozzle plate 21, a communication substrate 24, and a pressure chamber formation substrate 29, and bonded together, by adhesive or the like, so as to form a single unit. A diaphragm 31, piezoelectric elements 32 (one type of driving element), an interposing substrate 33 (one type of the second substrate of the invention), and a driving IC 34 are stacked on a face on the opposite side of the pressure chamber formation substrate 29 to the communication substrate 24. Note that for convenience, the stacking direction of the various members is described as the up-down direction.

The head case 16 is a box shaped member made from synthetic resin, and a liquid entry path 18 that supplies ink to a common liquid chamber 25, described below, is formed inside the head case 16. The liquid entry path 18, together with the common liquid chamber 25, configures a space where ink common to plural pressure chambers 30 provided in a row in the pressure chamber formation substrate 29, described below, is stored. A housing space 17 is formed in the head case 16 at a position away from the liquid entry path 18. The pressure chamber formation substrate 29, the interposing substrate 33, the driving IC 34, and the like, are housed inside the housing space 17. A wiring insertion port 19 that communicates with the housing space 17 is formed in the head case 16. The flexible substrate 35 (one type of the first substrate of the invention), which transmits drive signals and the like from a control circuit side of the printer 1 to the driving IC 34, is inserted into the wiring insertion port 19, and is connected to the substrate electrode terminals 49 formed on the upper face (mounting face) of the interposing substrate 33 inside the housing space 17.

The communication substrate 24 of the present embodiment is plate member made from silicon. As illustrated in FIG. 2, the communication substrate 24 is formed with the common liquid chamber 25, which is in communication with the liquid entry path 18 and stores ink common to the pressure chambers 30, and plural individual communication ports 26 that individually supply ink inside the common liquid chamber 25 to respective pressure chambers 30. Nozzle communication ports 27 that penetrate the plate thickness direction of the communication substrate 24 are formed at positions of the communication substrate 24 corresponding to respective nozzles 22. Namely, plural nozzle communication ports 27 are formed along a nozzle row direction so as to correspond to the respective nozzles 22.

The nozzle plate 21 is a substrate made from silicon bonded to the lower face of the communication substrate 24 (the face on the opposite side to the pressure chamber formation substrate 29). In the present embodiment, openings at the lower face side of the space forming the common liquid chamber 25 are sealed off by the nozzle plate 21. Plural of the nozzles 22 are opened in a straight line shape (a row pattern) in the nozzle plate 21. The plural nozzles 22 provided in a row (a nozzle row) are provided at uniform intervals along the secondary scanning direction orthogonal the primary scanning direction from one end side of the nozzles 22 to another end side of the nozzles 22, with a pitch corresponding to a dot formation density.

The pressure chamber formation substrate 29 is made from a silicon substrate similarly to the communication substrate 24 and the nozzle plate 21. The pressure chamber formation substrate 29 is anisotropically etched so as to provide plural spaces for forming the pressure chambers 30 in a row along the nozzle row direction. These spaces are bounded from below by the communication substrate 24 and are bounded from above by the diaphragm 31, thereby configuring the pressure chambers 30. The pressure chambers 30 are formed elongated in a direction intersecting the nozzle row direction. End portions on one length direction side of the respective pressure chambers 30 are in communication with the individual communication paths 26, and end portions on the other length direction side of the respective pressure chambers 30 are in communication with the nozzle communication paths 27.

The diaphragm 31 is a thin film member with elastic properties, and is stacked on the upper face of the pressure chamber formation substrate 29 (the face on the opposite side to the communication substrate 24 side). The diaphragm 31 seals off upper openings of the spaces for forming the pressure chambers 30. In other words, upper faces (ceiling faces) of the pressure chambers 30 are bounded by the diaphragm 31. Portions of the diaphragm 31 corresponding to the upper openings of the pressure chambers 30 function as displacement portions that are displaced along a direction moving away from, or a direction approaching, the nozzles 22 accompanying flexural deformation of the piezoelectric elements 32. Namely, regions of the diaphragm 31 corresponding to the upper openings of the pressure chambers 30 configure driving regions where flexural deformation is permitted. Deformation of the driving regions changes the capacity of the pressure chambers.

Note that the diaphragm 31 is, for example, configured from an elastic film composed of silicon dioxide ($SiO_2$) formed on the upper face of the pressure chamber formation substrate 29 and an insulating body layer composed of a zirconium oxide ($ZrO_2$) formed on the elastic film. The piezoelectric elements 32 are respectively stacked on regions corresponding to each of the pressure chambers 30 (namely, driving regions) on the insulating body layer (the face on the opposite side to the pressure chamber formation substrate 29 side of the diaphragm 31). The piezoelectric elements 32 of the present embodiment are what are known as flexural mode piezoelectric elements. The respective piezoelectric elements 32 are, for example, configured by stacking a lower electrode layer, a piezoelectric body layer, and an upper electrode layer, on the diaphragm 31 in that sequence. In the piezoelectric elements 32 configured in this manner, when an electric field is applied between the upper electrode layer and the lower electrode layer according to a potential difference between the two electrodes, the piezoelectric elements 32 flexurally deform in a direction moving away from, or a direction approaching, the nozzles 22. As illustrated in FIG. 2, lead electrodes 37 are laid down from respective piezoelectric elements 32 toward the outside of the piezoelectric elements 32 (namely, to a non-driving region away from the driving regions). The lead electrodes 37 are wiring lines for applying drive signals for driving the piezoelectric elements 32 to the piezoelectric elements 32, and are provided extending along a direction intersecting the nozzle row direction from the piezoelectric elements 32 to an end portion of the diaphragm 31.

The interposing substrate 33 of the present embodiment is configured from a crystalline substrate, specifically a monocrystalline silicon substrate, and is a member that functions as what is known as an interposer. Bonding resin 43 is interposed between the interposing substrate 33 and the diaphragm 31, and the interposing substrate 33 is disposed in a state forming a space that accommodates the piezoelectric elements 32. In the present embodiment, the surfaces, namely the upper face and the lower face of the interposing substrate 33 are made from (100) planes of monocrystalline silicon substrates. The driving IC 34, which outputs drive signals related to the driving of the piezoelectric elements 32, is disposed at the upper face side (corresponding to the mounting face of the invention, this being the face on the opposite side to the piezoelectric elements 32 side) of the interposing substrate 33. Drive signals, discharge data (raster data), and the like from the control circuit are input to the driving IC 34 through the flexible substrate 35, described below, and the driving IC 34 controls the selection of drive pulses, from out of the drive signals, that are respectively output to the piezoelectric elements 32 based on the discharge data. Input terminals 42 that are input with drive signals and the like from the flexible substrate 35, and output terminals 41 that are configured from a common terminal shared by the piezoelectric elements 32 and individual terminals provided so as to correspond to respective piezoelectric elements 32, are provided to the lower face (the face on the interposing substrate 33 side) of the driving IC 34.

The upper face (mounting face) of the interposing substrate 33 is connected to the input terminals 42 of the driving IC 34, and the substrate electrode terminals 49 (one type of the second electrode terminals of the invention) that connect to the wiring electrode terminals 36 of the flexible substrate 35 are formed on the upper face (mounting face) of the interposing substrate 33. Plural of the substrate electrode terminals 49 are provided in a row along the nozzle row direction on the upper face of the interposing substrate 33 so as to respectively correspond to each of the input terminals 42 of the driving IC 34. As illustrated in FIG. 3, plural trench shaped recesses 51 that extend along a direction (a direction orthogonal to the terminal array direction in the present embodiment) intersecting the array direction of the substrate electrode terminals 49 (the terminal array direction) are formed in strips so as to be separated at specific intervals along the terminal array direction. Anisotropic etching processing is performed on the monocrystalline silicon substrate that is the interposing substrate 33, as described below, to form the recesses 51. Protrusions 52 that have trapezoidal shapes in cross-section along the terminal array direction are formed between adjacent recesses 51. Conductive films 53 composed of conductive material such as gold (Au) are formed so as to cover the entire surface of the protrusions 52. The substrate electrode terminals 49 are mainly configured by the protrusions 52 and the conductive films 53. Note that insulating films 59 (see FIG. 8) are formed between the protrusions 52 and the conductive films 53 as described below. The occurrence of migration and shorting between adjacent electrode terminals can thereby be reduced. An adhesion layer such as titanium-tungsten (TiW) or nickel-chromium (NiCr) may also be provided between the insulating films 59 and the conductive films 53. The substrate electrode terminals 49 extend along a direction intersecting (orthogonal to) the terminal array direction on the upper face of the interposing substrate 33 from positions facing the input terminals 42 of the driving IC 34, through regions connected to the wiring electrode terminals 36 of the flexible substrate 35, to an end (edge) of the interposing substrate 33. Accordingly, the dimension (overall length) of each substrate electrode terminal 49 is sufficiently longer than the dimensions of the wiring electrode terminals 36 and the input terminals 42 along the direction intersecting the terminal array direction. In the present embodiment, the overall length of each substrate electrode terminal 49 is, for example, 400 μm.

The flexible substrate 35 (one type of the first substrate of the invention) is a flexible wiring substrate in which a wiring pattern is formed on one face of a rectangle shaped release film of polyimide or the like. At one end portion of the flexible substrate 35 (one type of the first substrate of the invention), plural of the wiring electrode terminals 36 (one type of the first electrode terminals of the invention) are provided in a row so as to correspond to the respective input terminals 42 of the driving IC 34. The other end portion of the flexible substrate 35 is provided with other terminal side terminals (not illustrated in the drawings) that are input with drive signals and the like from the control circuit. The surface of the wiring pattern on the flexible substrate 35 other than at the wiring terminals is covered by a solder resist. The one end portion of the flexible substrate 35 in communication with the housing space 17 through the wiring insertion port 19 is bent at a substantially right angle. The wiring electrode terminals 36 arranged further past (toward the one end side of) the bent portion are electrically connected to the substrate electrode terminals 49, with a bonding material 61 (see FIG. 3) of a non-conductive resin configured from a thermosetting resin that does not include conductive particles, or of an anisotropic conductive resin or the like configured from a thermosetting resin that does include conductive particles, interposed between the wiring electrode terminals 36 and the substrate electrode terminals 49. The wiring electrode terminals 36 of the flexible substrate 35 and the input terminals 42 of the driving IC 34 thereby have electrical continuity through the substrate electrode terminals 49.

Regarding the terminal array direction dimensions of the substrate electrode terminals 49 and the wiring electrode terminals 36, a dimension (top width) w1a of the substrate electrode terminals 49 at leading end faces (faces bonded to the wiring electrode terminals 36) is smaller than a dimension w2a of the wiring electrode terminals 36 at leading end faces (faces bonded to the substrate electrode terminals 49). Accordingly, in a state in which the flexible substrate 35 and the interposing substrate 33 are properly positioned and the substrate electrode terminals 49 and the wiring electrode terminals 36 have been connected, the leading end faces of the substrate electrode terminals 49 are kept within a range of the leading end faces of the wiring electrode terminals 36 in the terminal array direction. Namely, leading end faces of the substrate electrode terminals 49, as viewed along the connection direction of the electrode terminals, are contained within the leading end faces of the wiring electrode terminals 36 in the terminal array direction. Similarly, in the terminal array direction, a dimension w1b of base end portions (foundational portions) of the substrate electrode terminals 49 is smaller than a dimension w2b of base end portions of the wiring electrode terminals 36. In the present embodiment, in a configuration in which the terminals are formed with a pitch of 50 µm (the distance between centers of adjacent electrode terminals in the terminal array direction), the dimension w2a of the leading end faces of the substrate electrode terminals 49 is 15 µm and the dimension w2b of the base end portions of the substrate electrode terminals 49 is 20 µm, in contrast to the dimension w2a of the leading end faces of the wiring electrode terminals 36 being 20 µm and the dimension w2b of the base end portions of the wiring electrode terminals 36 being 25 µm. Accordingly, in the present embodiment, the design value of the minimum distance between terminals d for the electrode terminals is prescribed by the distance D2 between adjacent wiring electrode terminals 36 in the terminal array direction (approximately 13 µm).

Upper face side wiring lines 38 that are electrically connected to the output terminals 41 of the driving IC 34 are formed on the upper face of the interposing substrate 33 at positions away from the substrate electrode terminals 49. Plural of the upper face side wiring lines 38 are formed along the nozzle row direction so as to correspond to the respective piezoelectric elements 32. Other end portions of the upper face side wiring lines 38, which have one end portions that are connected to the output terminals 41, are connected to lower face side wiring lines 39 formed on the lower face of the interposing substrate 33 through penetrating wiring lines 45. The penetrating wiring lines 45 are wiring lines relaying between the lower face and the upper face of the interposing substrate 33, and are configured from a conductor such as metal formed inside penetrating holes that penetrate the interposing substrate 33 in the plate thickness direction.

Bump electrodes 40 that are respectively electrically connected to the lead electrodes 37 of the piezoelectric elements 32 are formed on the lower face (the face on the piezoelectric elements 32 side) of the interposing substrate 33. The bump electrodes 40 and the penetrating wiring lines 45 are connected through the lower face side wiring lines 39. The bump electrodes 40 of the present embodiment project toward the diaphragm 31 side of regions facing the lead electrodes 37 of the interposing substrate 33. The bump electrodes 40 are conductive layers of metal film or the like formed at locations on the surface of the diaphragm 31 side of elastic bodies that project out toward the diaphragm 31 side. The elastic bodies of the bump electrodes 40 of the present embodiment are formed projecting out along the nozzle row direction at the lower face of the interposing substrate 33. Plural of the conductive layers of the bump electrodes 40 are formed along the nozzle row direction so as to correspond to the respective piezoelectric elements 32. Such bump electrodes 40 have their conductive layers pressed against the lead electrodes 37 to establish conductivity with the lead electrodes 37.

The interposing substrate 33 and the pressure chamber formation substrate 29 (specifically, the pressure chamber formation substrate 29 onto which the diaphragm 31 has been stacked) are bonded together by bonding resin 43 in a state in which the bump electrodes 40 are interposed therebetween. In addition to functioning as an adhesive agent that bonds the interposing substrate 33 and the pressure chamber formation substrate 29 together, the bonding resin 43 functions as a spacer that forms a gap between the interposing substrate 33 and the pressure chamber formation substrate 29, the gap being to the extent that the driving of the piezoelectric elements 32 is not obstructed, and the bonding resin 43 functions as a sealing member that encloses the region where the piezoelectric elements 32 are formed such that the region is sealed off. Note that, for example, a thermosetting resin having an epoxy resin, an acrylic resin, a phenol resin, a polyimide resin, a silicone resin, a styrene resin, or the like as its primary component, and that includes a photopolymerization initiator or the like, may be suitably employed as the bonding resin 43.

In the recording head 3 formed as described above, ink from the ink cartridge 7 is introduced to the pressure chambers 30 through the liquid entry path 18, the common liquid chamber 25, and the individual communication ports 26. In this state, drive signals are selectively applied to the piezoelectric elements 32 from the driving IC 34 through the penetrating wiring lines 45 and other respective wiring and the like, in accordance with discharge data input to the driving IC 34 from the flexible substrate 35 through the substrate electrode terminals 49 and the input terminals 42. The piezoelectric elements 32 are thereby driven such that pressure fluctuations occur in the pressure chambers 30, and these pressure fluctuations are controlled to eject ink droplets from the nozzles 22.

Figure 7:
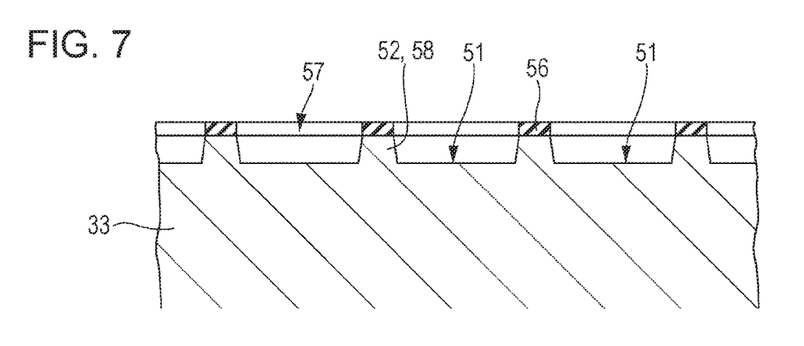
FIG. 7 is a process diagram illustrating a MEMS device manufacturing method.
Figure 8:
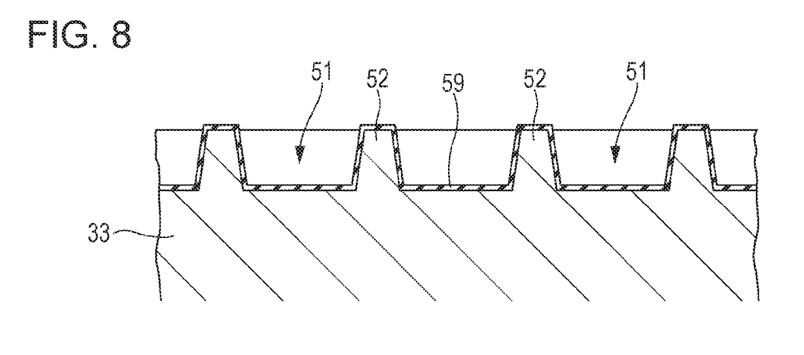
FIG. 8 is a process diagram illustrating a MEMS device manufacturing method.

Next, explanation is given regarding a process of manufacturing the recording head 3, and particularly a process of forming the substrate electrode terminals 49 of the interposing substrate 33, with reference to FIG. 6 to FIG. 13. First, a mask 56 is formed on a face that will be the mounting face of the monocrystalline silicon substrate that is the material of the interposing substrate 33 (a mask forming process). The mask may be, for example, a silicon oxide film, a silicon nitride film, a resist configured from a photosensitive resin, or the like, as long as it functions as a mask in the anisotropic etching (wet etching) process, described below. After forming the mask 56, the mask 56 is exposed and developed such that plural mask openings 57 are formed in the mask 56 with a specific pitch along a direction that will be the terminal array direction. The mask openings 57 are openings elongated in a direction intersecting (orthogonal to) a direction corresponding to the terminal array direction. Then, an etching solution composed of potassium hydroxide (KOH) is introduced from the mask openings 57 side to perform a protrusion forming process. The rate that the upper and lower crystalline surfaces of the interposing substrate 33 is etched by the etching fluid is higher than the rate that other crystalline surfaces are etched. Accordingly, as illustrated in FIG. 7, exposed portions of the interposing substrate 33 inside the mask openings 57 are gradually dug out in the thickness direction by being exposed to the etching solution so as to form the recesses 51. The protrusions 52 are thereby formed between adjacent recesses 51. Side faces 58 in directions corresponding to the terminal array direction of the protrusions 52 (inner wall faces of the recesses 51) form orthogonal or inclined faces with respect to the upper and lower faces, according to the crystal orientation of the upper and lower faces of the interposing substrate 33. The upper and lower faces of the interposing substrate 33 of the present embodiment are (100) planes, and the side faces 58 of the protrusions 52 are inclined with respect to the upper and lower faces so as to approach the side face 58 of an adjacent protrusions 52 on progression toward the bottom face of the recesses 51. As illustrated in FIG. 8, the concentration of the etching solution, the processing time, the temperature, and the like, are managed such that the recesses 51 reach a specific depth.

In the present embodiment, when the protrusion forming process has completed, the protrusions 52 formed between the recesses 51 have trapezoidal shapes in a cross-section taken along the terminal array direction. Thus, the mounting face of the interposing substrate 33 is anisotropically etched so as to enable forming the protrusions 52 with more precise dimensions and shapes. Note that the protrusions 52 are not limited to being processed by wet etching, and can be formed by dry etching so long as the protrusions 52 are able to be precisely formed. The shapes of the protrusions 52 are also not necessarily trapezoidal shapes in cross-section, and may be rectangular shapes, square shapes, or the like, in cross-section. The shapes of the leading end faces of the protrusions 52 in plan view (the shapes when viewed along the connection direction of the electrode terminals) are rectangular shapes or parallelogram shapes, according to the crystal orientation of the interposing substrate 33.

Figure 9:
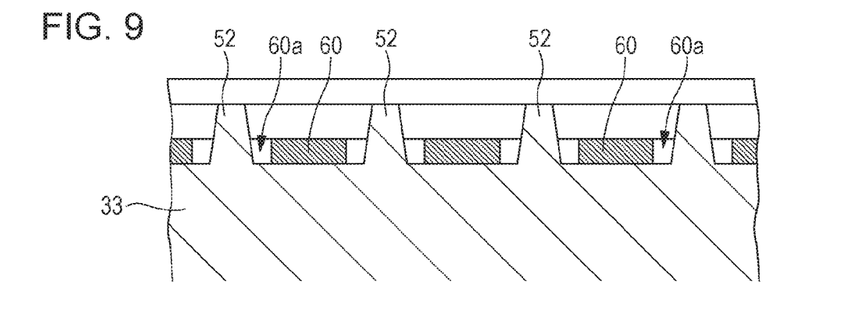
FIG. 9 is a process diagram illustrating a MEMS device manufacturing method.
Figure 10:
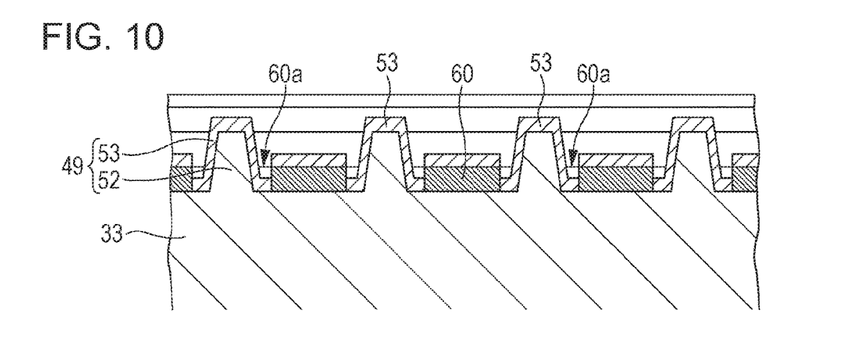
FIG. 10 is a process diagram illustrating a MEMS device manufacturing method.

Then, as illustrated in FIG. 8, an insulating film 59 such as a silicon oxide ($SiO_2$) is formed by thermal oxidation or the like on the upper face of the interposing substrate 33 formed with the recesses 51 and the protrusions 52 (an oxide layer forming process). Note that the insulating film 59 is omitted from illustration except for in FIG. 8. Next, as illustrated in FIG. 9 and FIG. 10, the conductive films 53 are formed so as to cover the surface of the protrusions 52 (a conductive film forming process). In the conductive film forming process, a conductive film mask 60 formed with openings 60a exposing the protrusions 52 is employed to deposit a conductive material such as gold (Au) by sputtering. The conductive films 53 are thereby formed in a state covering the surface of the protrusions 52 exposed inside the openings 60a of the conductive film mask 60. Note that a method other than a sputtering method, such as a CVD method or a plating method, may be adopted as the method of forming the conductive films 53. Once the conductive films 53 have been formed, the resist layer, this being the conductive film mask 60, is removed such that the substrate electrode terminals 49 are formed on the upper face of the interposing substrate 33. Thus, the surface of the protrusions 52 formed by anisotropic etching is covered by the conductive film 53 so as to enable more dimensionally precise substrate electrode terminals 49 to be obtained. In particular, the dimensions and the surface area of the leading end faces of the substrate electrode terminals 49 can be obtained with higher precision due to anisotropic etching. Note that the upper face side wiring lines 38, the lower face side wiring lines 39, and the like, can be similarly formed by the above process simultaneously.

Figure 11:
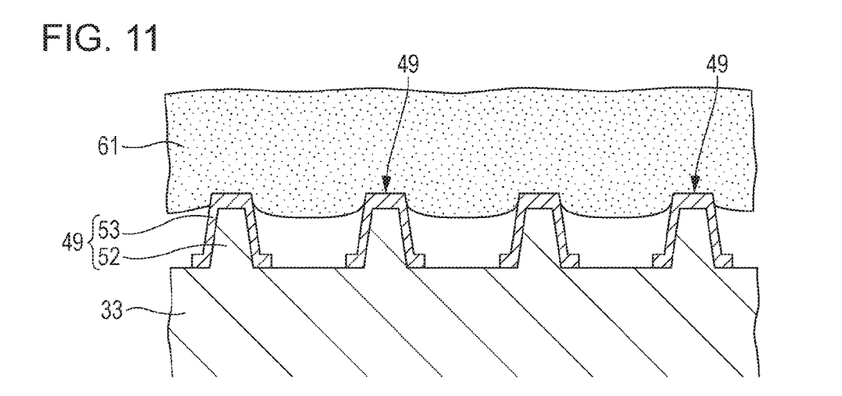
FIG. 11 is a process diagram illustrating a MEMS device manufacturing method.
Figure 12:
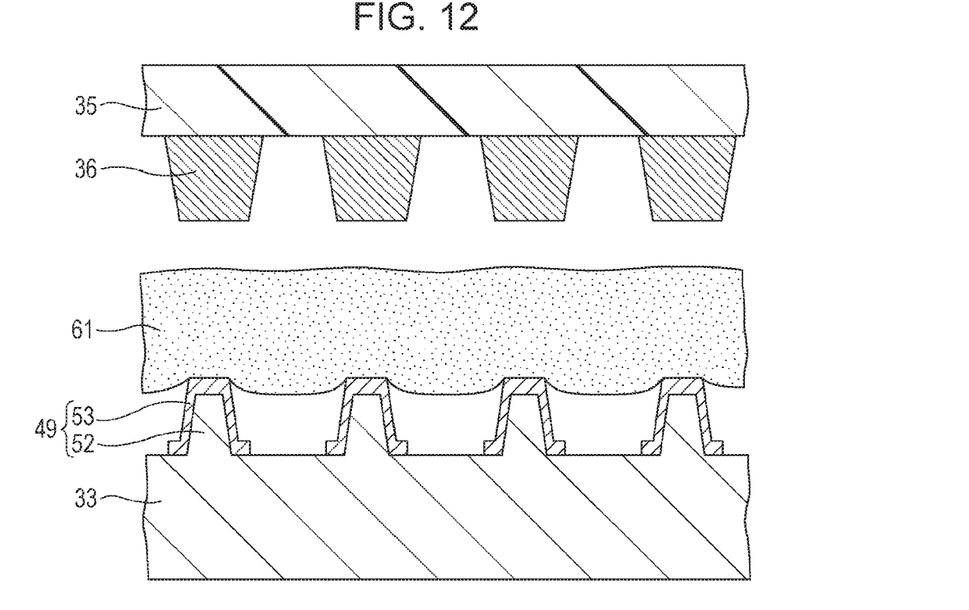
FIG. 12 is a process diagram illustrating a MEMS device manufacturing method.

Once the substrate electrode terminals 49 have been formed on the upper face of the interposing substrate 33, the flexible substrate 35 then is mounted on the interposing substrate 33 in a state in which the nozzle plate 21, the communication substrate 24, the pressure chamber formation substrate 29, the diaphragm 31, the piezoelectric elements 32, the interposing substrate 33, and the driving IC 34 have been sequentially stacked and assembled together. Specifically, first, as illustrated in FIG. 11, bonding material 61, in a state prior to curing, is layered on the substrate electrode terminals 49 by being transferred to (when a film) or coated on (when a paste) the substrate electrode terminals 49 on the upper face (mounting face) of the interposing substrate 33. Then, as illustrated in FIG. 12, the relative positions of the interposing substrate 33 and the flexible substrate 35 are adjusted such that the substrate electrode terminals 49 on the mounting face of the interposing substrate 33 and the wiring electrode terminals 36 on the flexible substrate 35 are in one-to-one correspondence (an alignment process). Note that portions of the flexible substrate 35 further toward the other end side of the flexible substrate 35 than the one end portion provided with the wiring electrode terminals 36 adopt a standing position with respect to the pre-bent mounting face of the interposing substrate 33. In the alignment process, the relative positions of the flexible substrate 35 and the interposing substrate 33 are adjusted using a jig or the like such that the bonding faces of the substrate electrode terminals 49 are disposed in the terminal array direction within a range of the bonding faces of the corresponding wiring electrode terminals 36. Thus, as described below, the minimum distance between terminals d is suppressed from becoming smaller than a design value (D2 in the present embodiment).

Figure 13:
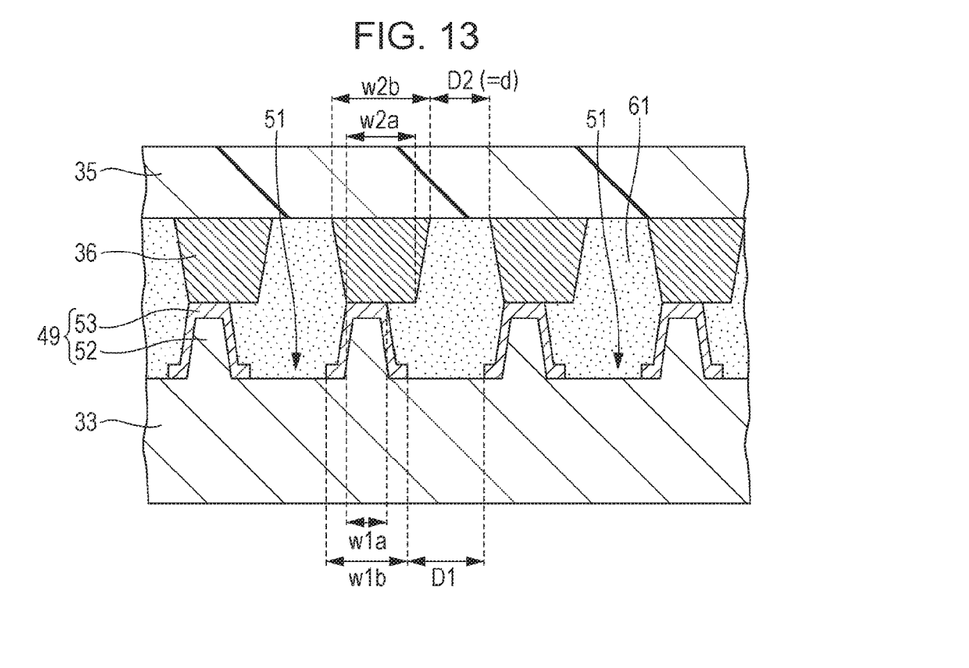
FIG. 13 is a process diagram illustrating a MEMS device manufacturing method.

In a state in which the interposing substrate 33 and the flexible substrate 35 have been positioned, as illustrated in FIG. 13, the interposing substrate 33 and the flexible substrate 35 are compression bonded together by a compression bonding tool, not illustrated in the drawings, in a state in which the bonding material 61 is interposed between the interposing substrate 33 and the flexible substrate 35 (a compression bonding process). When this occurs, overlapping portions of the wiring electrode terminals 36 and the substrate electrode terminals 49 are subject to heat and pressure from the wiring electrode terminals 36 side toward the substrate electrode terminals 49 side using the compression bonding tool. The wiring electrode terminals 36 of the flexible substrate 35 are thereby lowered so as to abut corresponding substrate electrode terminals 49 while displacing bonding material 61 softened by heat. In cases in which the bonding material 61 does not include conductive particles, the wiring electrode terminals 36 and the substrate electrode terminals 49 directly contact due to the load so as to be electrically connected. In cases in which the bonding material 61 includes conductive particles, load from the compression bonding tool concentrates on overlapping portions of the wiring electrode terminals 36 and the substrate electrode terminals 49 and conductive particles in these portions are crushed and piled on each other, for example, and the wiring electrode terminals 36 and the substrate electrode terminals 49 are electrically connected through the conductive particles. The bonding material 61 displaced (expelled) from between the wiring electrode terminals 36 and the substrate electrode terminals 49 is introduced into the gap including the recesses 51 between the electrode terminals.

The flexible substrate 35 is mounted on the mounting face of the interposing substrate 33 through the above processes. Thus, due to anisotropically etching the interposing substrate 33, this being a monocrystalline silicon substrate, the substrate electrode terminals 49 are configured including protrusions 52 formed with highly precise dimensions and shapes and including conductive films 53 covering the protrusions 52. Positional displacement between the substrate electrode terminals 49 and the wiring electrode terminals 36 resulting from an error in the dimensions or the like of the substrate electrode terminals 49 is thereby less liable to occur. Accordingly, faults such as migration due to the minimum distance between terminals d being smaller than a design value due to positional displacement between electrode terminals can be suppressed. The reliability of the connection between the substrate electrode terminals 49 and the wiring electrode terminals 36 is therefore increased. Namely, as described above, the dimension w1a of the substrate electrode terminals 49 at the bonding faces (leading end faces) is smaller than the dimension w2a of the wiring electrode terminals 36 at the bonding faces in the terminal array direction, and so long as there is no gross positional displacement of terminals (for example, that exceeding a positional displacement tolerance), the bonding faces of the substrate electrode terminals 49 are kept within a range of bonding faces of the wiring electrode terminals 36 in the terminal array direction. In other words, leading end faces of the substrate electrode terminals 49 are contained within leading end faces of the wiring electrode terminals 36 along the terminal array direction, as viewed along the connection direction of the electrode terminals. Thus, for example, even if positional displacement occurs between the substrate electrode terminals 49 and the wiring electrode terminals 36 along the terminal array direction as illustrated in FIG. 13 resulting from a positioning error between the flexible substrate 35 and the interposing substrate 33, an error in the dimensions of the wiring electrode terminals 36 of the flexible substrate 35, or the like, the minimum distance between terminals d between adjacent terminals is held constant at D2, this being the design value in the present embodiment. Accordingly, faults such as migration due to the minimum distance between terminals d being smaller than the design value due to positional displacement or the like between electrode terminals can be suppressed. Adopting such a configuration enables an even more reliable recording head 3 and printer 1 to be provided.

The protrusions 52 and the recesses 51 between adjacent protrusions 52 extend along a direction intersecting (orthogonal to) the terminal array direction, and so even when the dimension w1a in the terminal array direction of the substrate electrode terminals 49 at bonding faces is configured smaller than the dimension w2a in the terminal array direction of the wiring electrode terminals 36 at the bonding faces, since the protrusions 52 extend along the direction intersecting the terminal array direction, a contact area that is effective for conduction between the substrate electrode terminals 49 and the wiring electrode terminals 36 can be sufficiently secured along this direction. In configurations in which the substrate electrode terminals 49 and the wiring electrode terminals 36 are connected by compression bonding using a bonding material 61 such as non-conductive resin, sufficient bonding strength and electrical insulation between electrode terminals can be more reliably secured due to the introduction of bonding material 61 displaced from between the substrate electrode terminals 49 and the wiring electrode terminals 36 into the recesses 51 between adjacent protrusions 52. As a result, the reliability of the connection between the substrate electrode terminals 49 and the wiring electrode terminals 36 can be increased even further.

Note that in the above, although an example has been given in which a flexible substrate 35 having flexibility serves as a first substrate in the invention, there is no limitation thereto, and a rigid substrate not having flexibility may serve as the first substrate. For example, the invention can be applied to configurations in which the driving IC 34 is a first substrate of the invention and the input terminals 42 of the driving IC 34 are first electrode terminals connected to the substrate electrode terminals 49, these being second electrode terminals, of an interposing substrate 33 serving as a second substrate.

Figure 14:
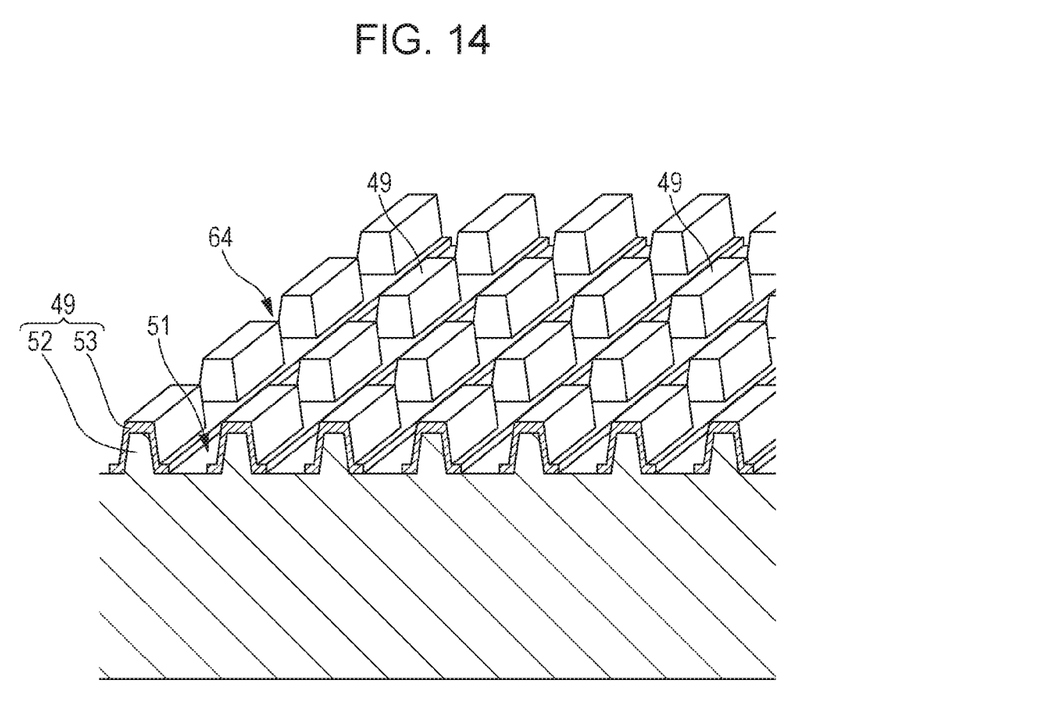
FIG. 14 is a perspective view of second electrode terminals of a second embodiment.
Figure 15:
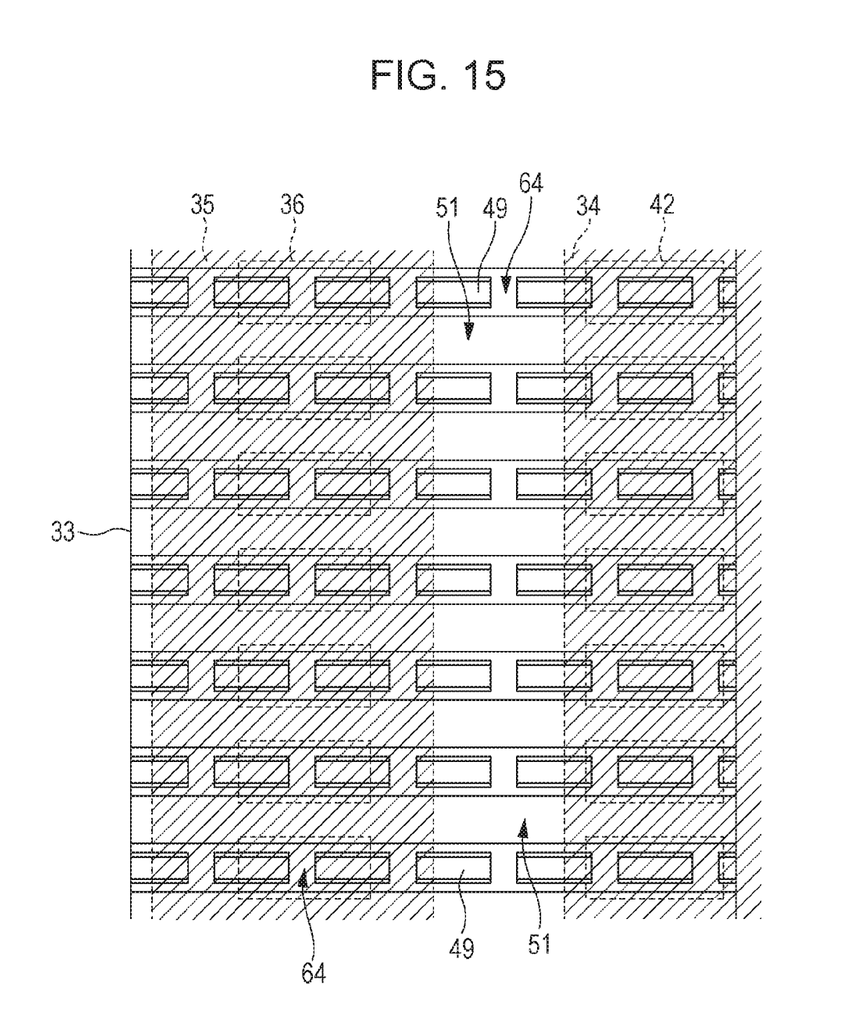
FIG. 15 is a plan view of second electrode terminals of a second embodiment.

FIG. 14 and FIG. 15 are drawings illustrating configuration of substrate electrode terminals 49 of a second embodiment of the invention. FIG. 14 is a perspective view, and FIG. 15 is a plan view. The present embodiment is the same as the first embodiment in that the mounting face of the interposing substrate 33 is anisotropically etched and recesses 51 extending along the direction intersecting the terminal array direction are formed with a specific pitch in the terminal array direction to form protrusions 52 between adjacent recesses 51. The present embodiment differs from the first embodiment in that transverse grooves 64 extending along the terminal array direction crossing the recesses 51 and the protrusions 52 are formed with a specific pitch in the direction intersecting the terminal array direction (the extension direction of the protrusions 52). The transverse grooves 64 are formed by anisotropically etching in the protrusion forming process. The protrusions 52 are divided into plural island shaped portions by the transverse grooves 64. The widths of the transverse grooves 64 in the extension direction of the protrusions 52 are set smaller than the dimension of the first electrode terminals, namely the wiring electrode terminals 36 and the input terminals 42, connected to the substrate electrode terminals 49. In a process of connecting the wiring electrode terminals 36 and the substrate electrode terminals 49 using the bonding material 61, providing the transverse grooves 64 allows bonding material 61 displaced from between the wiring electrode terminals 36 and the substrate electrode terminals 49 to be introduced into the transverse grooves 64 such that an even greater bonding strength and an even greater electrical insulation can be obtained and the reliability of the connection between the first electrode terminal and the second electrode terminal can be increased even further.

The invention can also be applied to configurations in which, for example, a driving IC is provided to a flexible substrate (configurations not including an interposing substrate). Namely, the invention can be applied to configurations in which plural electrode terminals (for example, the lead electrodes 37) of driving elements (actuators) such as piezoelectric elements are provided to a second substrate (for example, a pressure chamber formation substrate 29) made from silicon as second electrodes, and these electrode terminals are connected to wiring electrode terminals, these being the first electrode terminals of a flexible substrate such as a COF serving as a first substrate.

Moreover, the invention can be applied to MEMS devices in which the electrode terminals of plural substrates are electrically connected together. For example, the invention can be applied to MEMS devices such as sensors that detect pressure changes, vibration, displacement, or the like in movable regions.

In the above embodiments, although explanation has been given regarding an example in which an ink jet recording head 3 serves a liquid ejecting head, the invention can be applied to other liquid ejecting heads in which the electrode terminals of plural substrates are electrically connected together. For example, the invention can be applied to colorant ejecting heads employed in the manufacture of color filters for liquid crystal displays or the like, electrode material ejecting heads employed to form electrodes of organic electroluminescent (EL) displays, field emission displays (FEDs), or the like, bioorganic matter ejecting heads employed in the manufacture of biochips (biochemical elements), and the like. In colorant ejecting heads for display manufacturing apparatuses, solutions of R (red), G (green), and B (blue) colors are each ejected as respective types of liquid. In electrode material ejecting heads for electrode forming apparatuses, a liquid electrode material is ejected as one type of liquid, and in bioorganic matter ejecting heads for chip manufacturing apparatuses, a bioorganic matter solution is ejected as one type of liquid.

What is claimed is:

1. A liquid electing head comprising:
   a pressure chamber-forming plate in which a pressure chamber is formed, the pressure chamber being configured to be filled with a liquid;
   a nozzle in fluid communication with the pressure chamber;
   a vibration plate positioned on the pressure chamber-forming plate so as to overlap the pressure chamber in a cross-sectional view;
   a piezoelectric element positioned on the vibration plate, the piezoelectric element being directly adjacent to the pressure chamber via the vibration plate;
   a flexible substrate having a plurality of first electrode terminals thereon, each of the plurality of first electrode terminals being a first projection projecting from a surface of the flexible substrate, and adjacent pairs of the plurality of first electrode terminals being spaced apart from each other via a first distance in a terminal array direction in a cross sectional view; and
   a crystalline substrate having a plurality of second electrode terminals, each of the plurality of second electrode terminals being a second projection having a conductive layer covering the second projection, and adjacent pairs of the plurality of second electrode terminals being spaced apart from each other via a second distance in the terminal array direction in the cross sectional view,
   wherein the crystalline substrate is disposed above the piezoelectric element via a space so that the piezoelectric element is deformable in the space, and the flexible substrate is disposed at a side opposite to the piezoelectric element with respect to the crystalline substrate,
   a tip of each of the plurality of first projections is connected to a corresponding tip of each of the plurality of second projections, and
   each of the plurality of second projections is unitary with the crystalline substrate.

2. The liquid electing head according to claim 1, wherein the first distance is smaller than the second distance.

3. A liquid ejecting apparatus comprising:
   the liquid ejecting head according to claim 2;
   a carriage on which the liquid electing head is mounted; and
   a motor that is configured to move the carriage.

4. The liquid ejecting head according to claim 1, wherein the plurality of first and second protrusions extend in a direction intersecting the terminal array direction.

5. A liquid ejecting apparatus comprising:
   the liquid ejecting head according to claim 4;
   a carriage on which the liquid ejecting head is mounted; and
   a motor that is configured to move the carriage.

6. The liquid ejecting head according to claim 1, wherein a silicon oxide film is provided between the conductive layer and each of the plurality of second protrusions.

7. A liquid ejecting apparatus comprising:
   the liquid ejecting head according to claim 6;
   a carriage on which the liquid ejecting head is mounted; and
   a motor that is configured to move the carriage.

8. A liquid ejecting apparatus comprising:
   the liquid ejecting head according to claim 1;
   a carriage on which the liquid ejecting head is mounted; and
   a motor that is configured to move the carriage.

* * * * *